United States Patent
Kennedy et al.

(10) Patent No.: US 7,251,296 B2
(45) Date of Patent: Jul. 31, 2007

(54) SYSTEM FOR CLOCK AND DATA RECOVERY

(75) Inventors: Chris Kennedy, San Jose, CA (US); Carlos Henriquez, San Jose, CA (US); Kevin Hester, Belmont, CA (US)

(73) Assignee: Ciena Corporation, Linthicum, MD (US)

( * ) Notice: Subject to any disclaimer, the term of this patent is extended or adjusted under 35 U.S.C. 154(b) by 721 days.

(21) Appl. No.: 10/161,217

(22) Filed: May 31, 2002

(65) Prior Publication Data

US 2003/0223520 A1    Dec. 4, 2003

(51) Int. Cl.
*H03D 3/18* (2006.01)
*H03D 3/24* (2006.01)
(52) U.S. Cl. .................... 375/327; 375/376
(58) Field of Classification Search .......... 713/400, 713/500, 501, 502; 375/326, 359, 327, 376; 327/144–153, 156–159
See application file for complete search history.

(56) References Cited

U.S. PATENT DOCUMENTS 4,536,876 A * 8/1985 Bahr et al. .................. 370/453
2005/0147197 A1* 7/2005 Perrott ....................... 375/376

* cited by examiner

*Primary Examiner*—Don N. Vo
(74) *Attorney, Agent, or Firm*—Clements Walker; Christopher L. Bernard; Tyler S. Brown

(57) ABSTRACT

A clock and data recovery (CDR) system that generates one or more clock signals from a received data stream and determines an optimal clock signal to associate with the incoming data stream. The system includes a candidate clock generation circuit that operates to receive the incoming data stream and generate candidate clock signals. A transition density detector circuit determines a transition density parameter associated with each of the candidate clock signals. A controller operates to determine the optimal clock signal based on the transition density parameters.

17 Claims, 5 Drawing Sheets

SYSTEM FOR CLOCK AND DATA RECOVERY

FIELD OF THE INVENTION

The present invention relates generally to data receivers, and more particularly, to a system for use in a data receiver to recover a clock signal from a received data stream.

BACKGROUND OF THE INVENTION

Optical networks are becoming widely used for distributing both high and low speed data over varying distances. Typically, an optical network is comprised of a number of network elements (NE) that are connected to each other in a variety of configurations so as to form a unified communication network. The communication network may extend over a small area, such as a company wide network, or may cover large distances, such as in regional or nationwide networks. Typically, the NE's allow network clients to input data for transmission over the network and to receive data transmitted over the network from other locations. Thus, data may be added or dropped from the network at NE locations as the data flows from point to point throughout the network.

A network element may include one or more transceivers that convert optical signals from one wavelength to another, or from an optical to an electrical signal, so that for example, data received at a first wavelength and bit rate is sent out at a different wavelength and bit rate. The transceiver may include both input and output tributaries that allow data to be received and transmitted to network users that are local to the network element. For example, an input tributary allows a network user to input signals at an NE for transmission over the network, and an output tributary allows a network user to receive signals at an NE that have been received from the network.

With respect to the input tributary of a transceiver, a network client may provide data without a corresponding clock signal for transmission over the network. For example, the data may be encoded using a non-return to zero (NRZ) encoding scheme, where a "0" is the absence of a pulse, and a "1" is the presence of a pulse. Furthermore, different network clients may input data having different data rates. As a result, one problem that exists is that network operators are required to set up the input tributaries to receive each client's data.

Typically, a tributary's input receiver is provisioned for an expected data rate. That means that the network client must inform the network operator about the rate that will be used, and the network operator must set up the tributary's input receiver to receive data at the selected data rate. This creates efficiency problems since the input tributary must always be set up correctly by the network operator to receive client data. If the client decides to input data at a higher or lower data rate, then the receiver must be adjusted to accommodate the new rate. In addition, it becomes difficult to add new traffic from a network client, since another tributary needs to be provisioned for the data rate of the new data. As a result, there exists a great burden on network operators to provision or adjust the tributary receivers for every new data stream, or rate change to an existing data stream.

One solution that has been used to solve the above problems is to use a clock and data recover circuit (CDR). Such circuits attempt to generate a clock from the received data, however, current implements of these circuits have several flaws. One problem that exists is that current CDR circuits may generate a clock signal that is only a harmonic of the desired clock signal. By locking a harmonic of the desired clock signal to the data, downstream processors will experience large data error rates. Another problem that exists with current CDR circuits is that if something close to the desired clock is generated, there exist phase and frequency errors that also contribute to high error rates.

Therefore, it would be desirable to have a way to automatically determine and lock onto a clock signal that is optimal for a received data stream, thereby reducing the burden on network operators to set up and adjust tributary receivers, and providing a highly accurate clock signal that results in very low data error rates.

SUMMARY OF THE INVENTION

The present invention includes a clock and data recovery (CDR) system that generates one or more clock signals from a received data stream and determines an optimal clock signal to associate with the incoming data stream. For example, in a receiver system, an incoming data stream may be provided without a corresponding clock signal so that only one signal is received. One or more embodiments included in the present invention operate to generate the optimal clock for the data stream and lock the generated clock to the data so that downstream processing systems are able to process the received data with high accuracy and without errors.

The system provides a way to generate a clock to associate with a received data stream in high performance transmission systems where the data may be provided without an associated clock signal, i.e., NRZ encoded. Embodiments included in the present invention may be used in a variety of applications, including both electrical and optical transmission systems. For example, the system may be used in a network transceiver so that a clock signal can be recovered from data streams having a wide range of bit rates. The resulting transceiver does not require setup or adjustment by a network operator for new client data, or rate changes to existing client data. Thus, it is possible to use a single transceiver for all received bit rates, thereby easing the burden on network operators to adjust transceivers for each client's data.

In one embodiment, the system measures a transition density (TD) parameter to determine which of several generated clock signals is the optimal clock signal. This optimal clock signal is locked to the data. Thus, the system is able to determine the optimal clock signal for a data stream having virtually any bit rate. Furthermore, the clock recovery occurs with no prior knowledge of the expected data rate.

In one embodiment of the invention, a system for determining an optimal clock signal to associate with an incoming data stream is provided. The system includes a candidate clock generation circuit that operates to receive the incoming data stream and generate at least one candidate clock signal. A transition density detector circuit is included that operates to receive the incoming data stream and a selected candidate clock signal to determine a transition density parameter associated with the selected candidate clock signal. Lastly, a controller is provided that is coupled to the generation circuit and the detector circuit and operable to selectively input each of the at least one candidate clock signals to the detector circuit as the selected candidate clock signal so that one or more transition density parameters are determined. The controller operates to determine the optimal clock signal from the at least one candidate clock signal based on the one or more transition density parameters.

In another embodiment of the invention, a method is provided for determining an optimal clock signal to associate with an incoming data stream. The method includes the steps of receiving the incoming data stream, generating at least one candidate clock signal from the incoming data stream, selecting a selected candidate clock signal from the at least one candidate clock signal, determining a transition density parameter associated with the selected candidate clock, repeating the steps of selecting and determining until all of the at least one candidate clock signals have been selected and at least one transition density parameter has been determined, and determining the optimal clock signal from the at least one candidate clock signal based on the at least one transition density parameter.

BRIEF DESCRIPTION OF THE DRAWINGS

The foregoing aspects and the attendant advantages of this invention will become more readily apparent by reference to the following detailed description when taken in conjunction with the accompanying drawings wherein.

DETAILED DESCRIPTION OF THE INVENTION

The present invention includes a system for determining an optimal clock to associate with a received data stream. For example, in a system where the received data stream is not accompanied by synchronizing clock signal, the system operates to process the received data stream to generate candidate clock signals and select the optimal candidate clock to use to further process the incoming data stream. Thus, various embodiments of the system included in the present invention are discussed in detail in the following text.

EXEMPLARY EMBODIMENT

Figure 1:
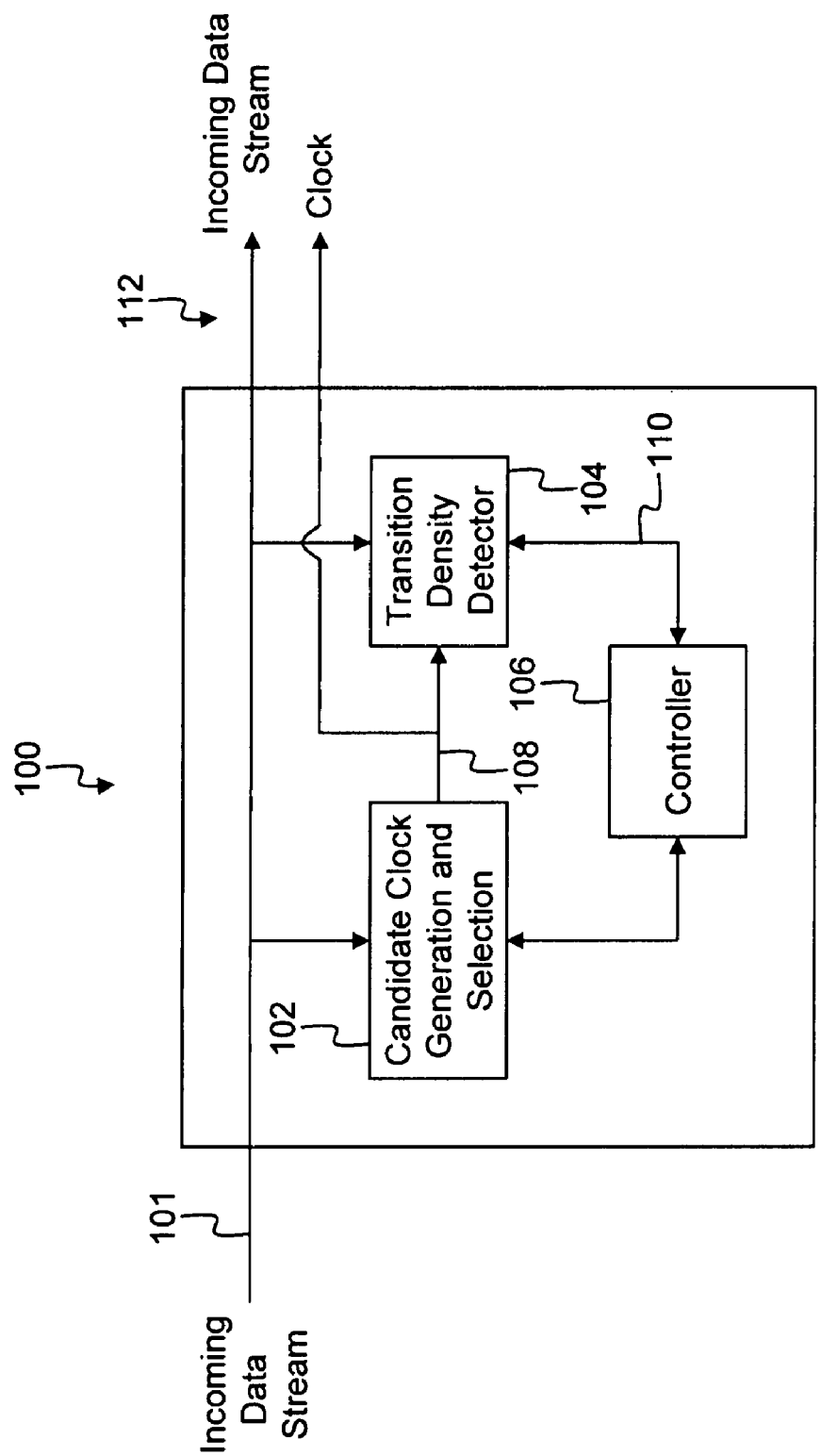
FIG. 1 shows an overview of a system for clock recovery constructed in accordance with the present invention.

FIG. 1 shows an overview of a system 100 for clock recovery constructed in accordance with the present invention. The system 100 receives as input a data stream 101 that does not have a corresponding clock signal. For example, the input data stream may be encoded in an NRZ format so that only a signal data stream is received.

The system 100 includes candidate clock generation and selection logic 102, transition detector logic 104 and a controller 106. The candidate clock generation logic 102 receives the incoming data stream and generates a candidate clock signal 108 that is input to the transition detector logic 104. The controller 106 is coupled to the selection logic 102 and operates to control the generation of the candidate clock signal 108.

The transition density detector operates to receive the candidate clock 108 and determine a transition density parameter 110. The transition density parameter is defined as the number of bit transitions in a selected observation time period. The transition density may be normalized and expressed as a percentage TD (%) because given a selected observation time T, the maximum number of transitions that a signal can have assuming a data rate equal to the candidate clock is expressed by:

MaxTransitions=Fcandidate_clock*T

TD (%)=MeasuredTransitions/MaxTransitions where MeasuredTransitions is the number of transitions of the candidate clock during the observation time T.

The transition density parameter 110 is transferred to the controller. Once the controller receives the transition density parameter, the controller controls the generation logic 102 to generate another candidate clock signal 108, for which a new transition density will be determined. The system 100 repeats the above process under the control of the controller until a transition density for all potential candidate clocks has been determined.

Once all the transition density parameters have been determined, the controller determines which of the generated candidate clocks to associate with the incoming data stream based on the transition density parameters. For example, as the frequency of the generated candidate clocks increases, the transition density parameters may also increase until a point is reached where the transition density parameters no longer increase. The controller may determine that the generated candidate clock having the lowest frequency and the high transition density parameter is the clock that is to be associated with the incoming data. Thus, the controller sets the generation logic 102 to generate the candidate clock that meets this criteria, and this clock is associated with the incoming data stream, (as shown at 112) for any additional downstream processing. Furthermore, once the clock is determined, the generation logic 102 operates to lock the clock to the data so that exact synchronization is maintained. Once this process is complete, only a major interruption of the data stream will disrupt the clock generation.

Figure 2:
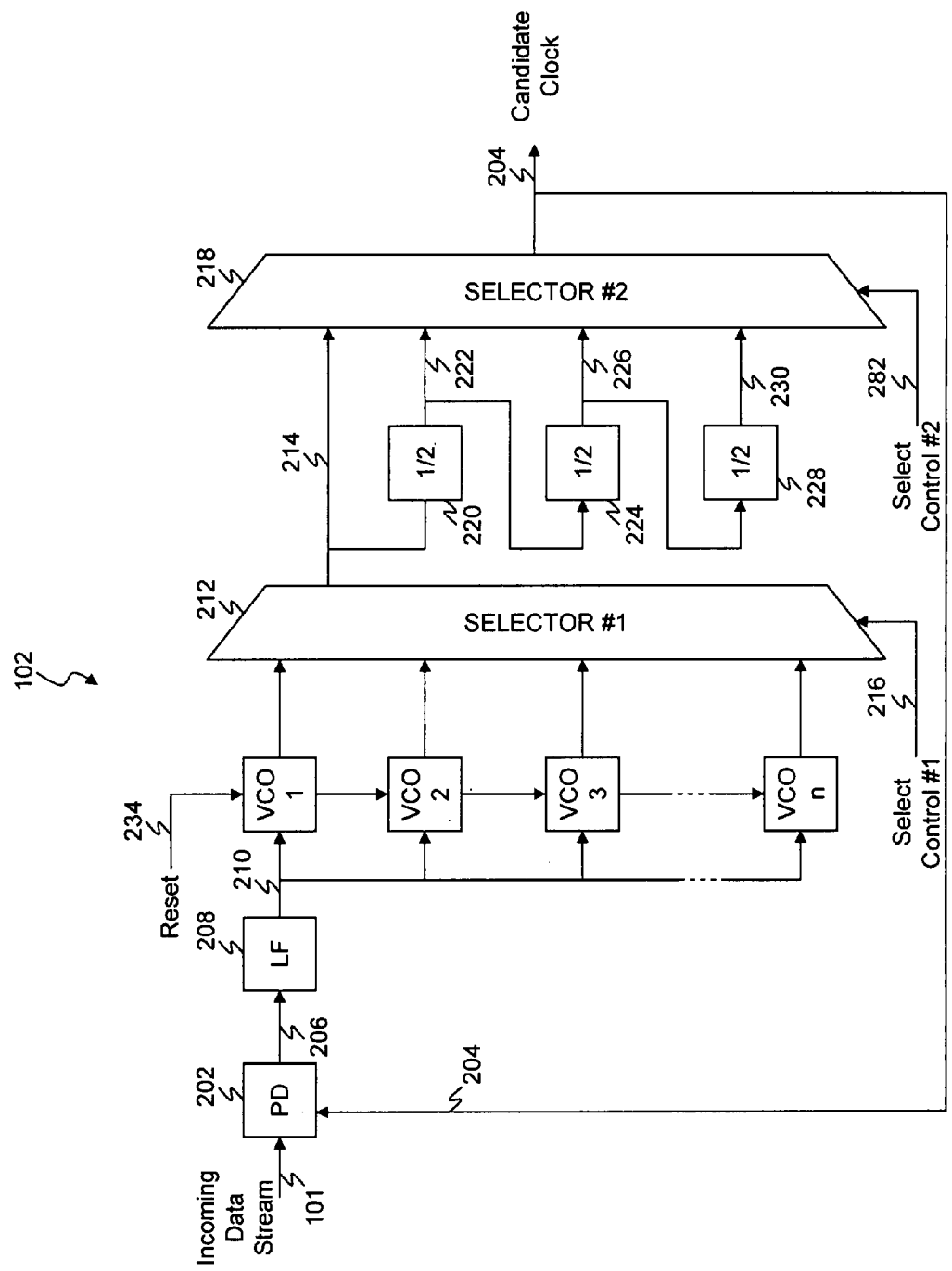
FIG. 2 shows an embodiment of a candidate clock generation circuit constructed in accordance with the present invention.

FIG. 2 shows an embodiment of the candidate clock generation circuit 102 constructed in accordance with the present invention. The generation circuit 102 operates to generate several candidate clocks based on the incoming data stream. A transition density for each candidate clock will be determined and one candidate clock will be selected to be associated with the incoming data stream.

The incoming data 101 is received by the generation circuit 102 at phase detector (PD) 202. As part of a feedback loop, the PD also receives the generated candidate clock signal 204 as a second input. An output 206 of the PD is input to a loop filter 208 that provides a filter output 210 that is input to a set (1 through n) of voltage controlled oscillators (VCO). Each VCO generates an output signal having a selected frequency that is determined by the voltage level of the filter output voltage 210. The number of VCOs determines the number of candidate clocks that can be generated. The VCOs output signals within a specific frequency range that is adjusted by the filter output voltage 210. The VCOs may be set up so that their output frequency ranges are distinct, or so that their output frequency ranges overlap with each other.

The VCO output signals are input to a first selector 212 that selects one of VCO signals to output at 214 based on a received select control signal 216. For example, there may be eight VCO input signals to the selector 212 and based on the control signal 216, one of the eight signals is provided at the output 214.

A second selector 218 receives the selected VCO signal from the output 214. In addition, the signal at output 214 is input to a first divide-by-two circuit 220. The circuit 220 operates to divide the frequency of the signal it receives by a factor of two. An output 222 of the circuit 220 is input to the second selector 218 and a second divide-by-two circuit 224. The circuit 224 operates identically to the circuit 220 and has an output 226 that is input to the second selector 218 and another divide-by-two circuit 228. The circuit 228 has an output 230 that is input to the second selector 218. Thus, the first selector output signal 214 is input to the second selector 218 along with three signals that are derived by dividing the output 214 by factors of two, four, and eight.

The second selector 218 operates to select one of the signals at its input to output as the candidate clock 204. The selection is controlled by a select control input 232. Once the candidate clock is selected, the selected clock is fed back to the PD 202 so that the feedback loop is completed and the selected clock can be locked to the incoming data stream. In effect, the generation logic 102 forms a phase lock loop (PLL) that locks the candidate clock 204 to the incoming data and tracks any frequency variations accurately. Although the circuit of FIG. 2 is shown dividing the output signal 214 by factors of two, four and eight, it is also possible within the scope of the invention to generate other factors of the signal 214. Logic to perform such a function is known by those with ordinary skill in the art.

Figure 3:
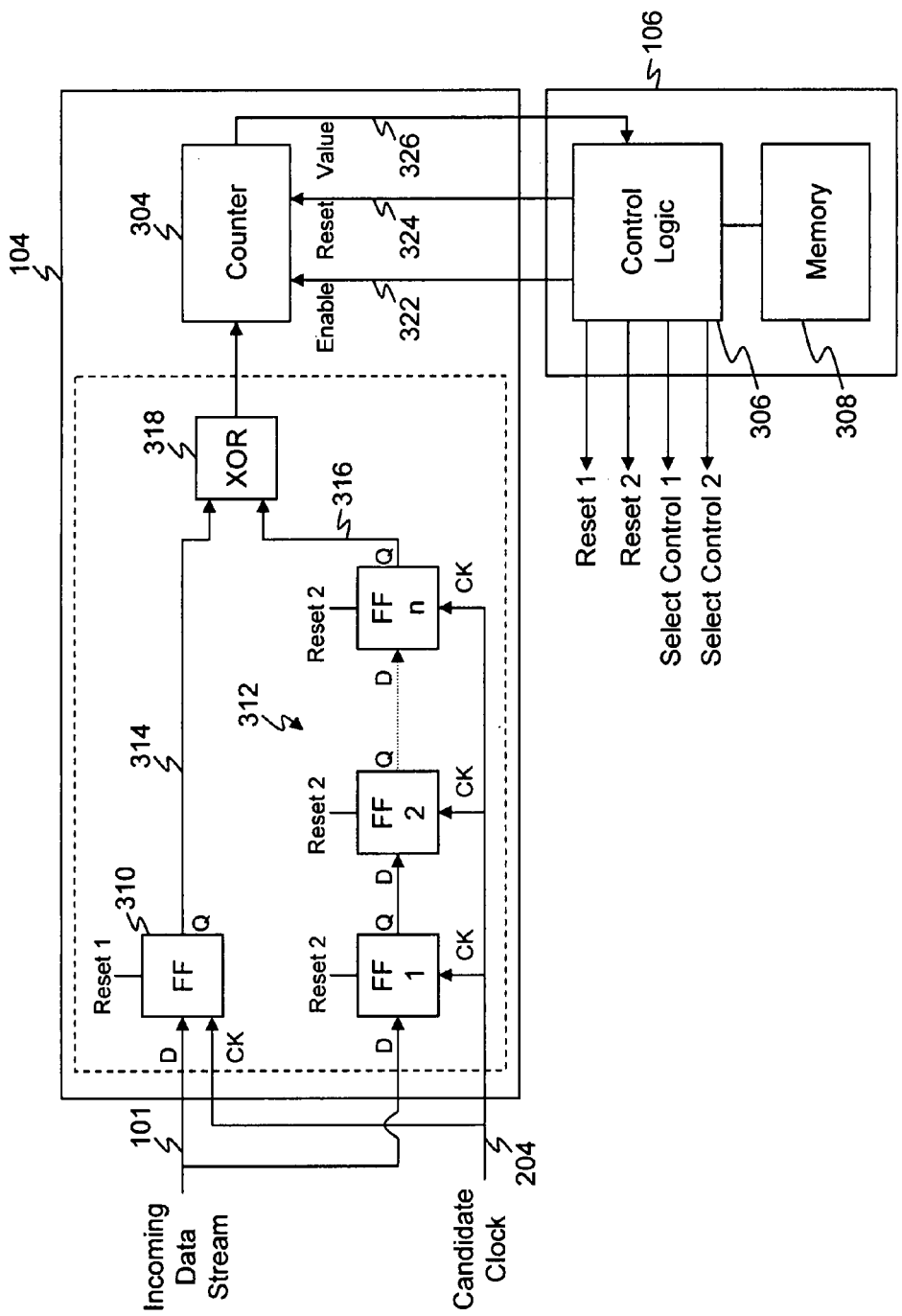
FIG. 3 shows one embodiment of the transition density detection circuit constructed in accordance with the present invention.

FIG. 3 shows one embodiment of the transition density detection circuit 104 constructed in accordance with the present invention. The circuit 104 includes comparator logic 302, and a counter 304. FIG. 3 also shows one embodiment of the controller 106, which includes control logic 306 and a memory 308.

The comparator logic 302 receives the incoming data stream 101 and the candidate clock signal 204 from the clock generation circuit 102. The comparator logic 302 includes a latch 310 and a latch chain 312 that includes a series of "n" latches. For example, the latch chain may include two latches (FF1 and FF2), or the latch chain may include n latches, for example eleven latches. The latches included in the latch chain 312 are coupled together so that the output of one latch is input to the next latch. Thus, the latch chain may be formed from a sequence D-type flip-flops. In another embodiment, the latch chain comprises a serial shift register that is n bits long. Furthermore, the latch 310 may be comprised of a D-type flip-flop. However, it is possible to use any suitable type of latch logic for the latch 310 and the latch chain 312.

The candidate clock signal 204 is used to drive the latch 310 and the latch chain 312. The output 314 of the latch 310 is coupled to a first input of a combinatorial gate 318. The output 316 of the latch chain 312 is coupled to a second input of the combinatorial gate 318. An output 320 of the combinatorial gate 318 is coupled to the counter 304. The combinatorial gate 318 comprises any suitable logic to provide an exclusive OR (XOR) function.

The counter 304 also receives as input an enable signal 322 and a reset signal 324, and outputs a counter value 326. The enable signal operates to enable/disable the counting function and the reset signal operates to reset the counter. The output 320 of gate 318 operates to clock the counter, so that for example, if the counter 304 is enabled, transitions on the output 320 will increment the counter value.

During operation of the transition density detector 104, the candidate clock is used to compare the incoming data stream to a delayed version of the incoming data stream. For example, if there are two latches in the latch chain 312, the present bit of the incoming data stream is compared to its previous bit by the XOR gate 318. A detected transition will be indicated at the output 320, which will increment the counter 304. Thus, if the counter is enabled for a selected time period, the detected transitions during this period will be counted by the counter. This count represents a transition density parameter that is associated with the candidate clock signal. It is also possible to use a large number of latch stages in the latch chain 312 to remove the effects of correlation of data stream. For example, the value n represents the number of latch stages in the latch chain 312, and may be set to a large number; for instance, n may be set to 11 or larger to overcome the effects of correlation when measuring transition density. For example, some data streams are very well scrambled and have very little correlation between adjacent bits (i.e., SONET streams), other data streams need a longer latch chain to deal with less robust encoding (i.e., Gigabit Ethernet).

The controller 106 includes the control logic 306 and a memory 308. The control logic comprising any type of suitable CPU, microprocessor, gate array, hardware logic, including any required software. The control logic 306 is operable to perform a timing function to determine selectable time periods. The control logic outputs the enable 322 and reset 324 signals to the counter 304. Using the timing function, the control logic is operable to first reset the counter using the reset signal 324, and then enable the counter for a selectable time period using the timing function and the enable signal 322. When the counter is enabled, transitions on the output 320 cause the counter to increment until the expiration of the time period, at which time the counter is disabled. The resulting count is transferred via the value signal 326, to the control logic, which stores the value in the memory 308. Thus, for any candidate clock, a counting operation can be performed for a selected time period and the result (transition density) stored in the memory for later processing.

In the system described above, the incoming data stream is sampled with a candidate clock to determine a transition density. In one embodiment, the ratio of counter value to number of candidate clock edges during a selected time period determines an optimal TD. When a transition density for each candidate clock is measured, the optimal TD will have a value generally greater than 50%.

Figure 4:
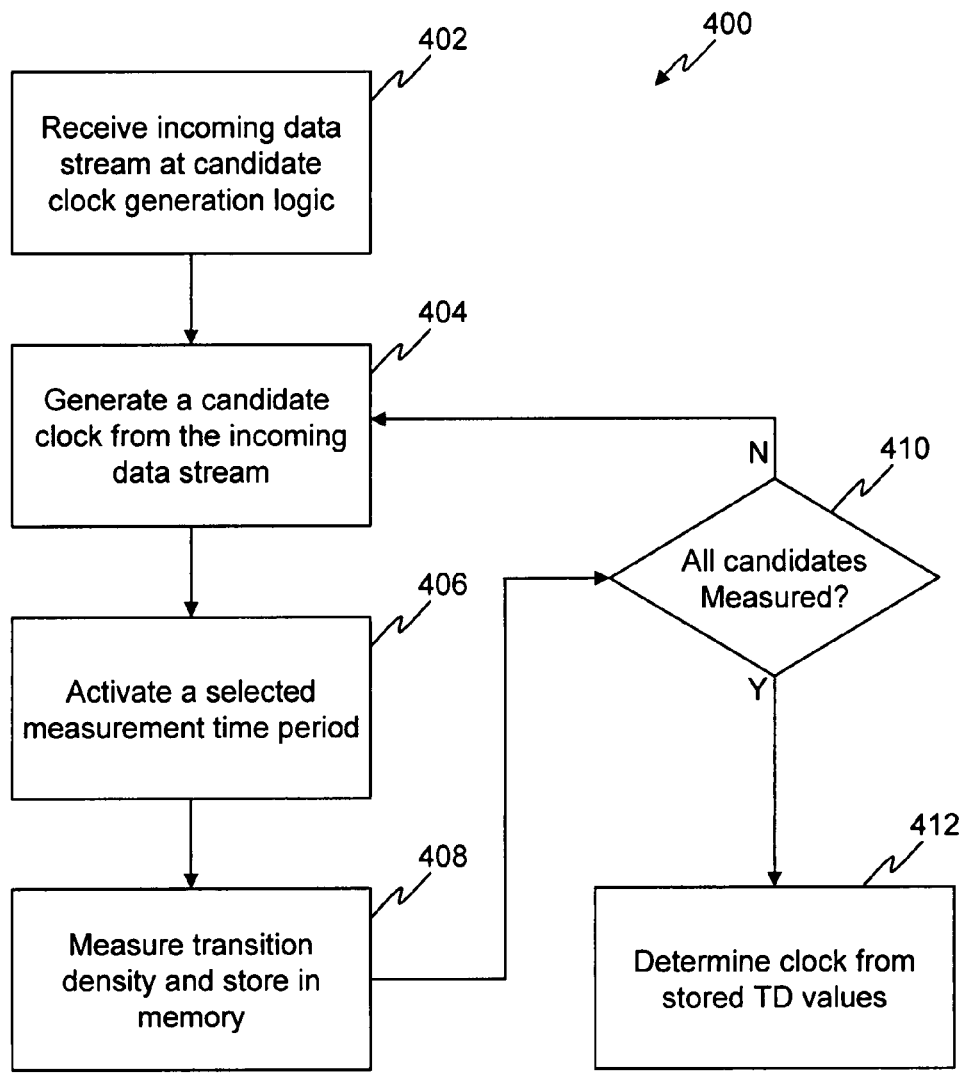
FIG. 4 shows a flow diagram for a method for determining an optimal clock to associate with an incoming data stream in accordance with the present invention.

FIG. 4 shows a flow diagram for a method 400 for determining an optimal clock to associate with an incoming data stream in accordance with the present invention. Although described with reference to a particular sequence of steps, other step sequences are possible within the scope of the invention. Thus, the method 400 is intended to be exemplary and not limiting of the scope of the invention to the sequence of steps shown.

At block 402, an incoming data stream is received at candidate clock generation logic. For example, the incoming data stream is received at the generation logic 102. At block 404, a candidate clock is generated from the incoming data stream. For example, the control logic 306 outputs values on the select control lines 1 and 2 so that selector 212 selects one of its VCO inputs to transfer to the output 214, and the selector 218 selects one of its clock inputs to transfer to its output 204 as a candidate clock signal. If necessary, the control logic 306 toggles a VCO reset 234 to reset the VCOs to start tracking the filter output 210.

At block 406, a measurement time period (observation time) is established and activated. For example, the observation time is determined by the lowest candidate frequency detected. In one embodiment the observation time is set to 100 million clock periods of the lowest candidate frequency in order to average out any short term variations in the number of transitions of the data stream. In another embodiment, the time period is set to a value of approximately 2 milliseconds.

At block 408, a transition density is measured over the measurement time period. For example, the control logic 306 resets the counter 304 via the reset 324, and then enables the counter via the enable 322. In the meantime, the generated candidate clock is used to operate the latch 310 and latch chain 312 so that transitions at the output 320 of the XOR gate 318 increment the counter 304. When the measurement period ends, the control logic disables the counter via the enable signal 322 and the count value 326 associated with the generated candidate clock is input to the control logic and thereafter stored in the memory.

At block 410, a test is performed to determine if the transition density for all candidate clocks has been determined. For example, the number of candidate clocks may be determined by the number of VCOs. However, any number of candidate clocks may be generated and tested in accordance with the invention. If all clocks have not been measured, the method proceeds to block 404 where the next candidate clock signal is generated and thereafter measured. If the transition density for all candidate clocks has been determined, the method proceeds to block 412.

At block 412, a particular candidate clock is determined from all the candidate clocks that have been measured. For example, if there are three VCOs coupled to the selector 212, each VCO will generate four frequencies that are input to the selector 218. Thus, twelve candidate clock signals can be generated. Each of the twelve signals will have an associated transition density value that was determined over the measurement time period. In one embodiment of the invention, to select the particular candidate clock, the control logic selects the lowest frequency candidate clock having the highest transition density. However, other selection techniques may be used within the scope of the invention. For example, other techniques that avoid selecting an undesired harmonic. Thus, the above method can be used to generate an accurate clock signal to associate with an incoming data stream.

Figure 5:
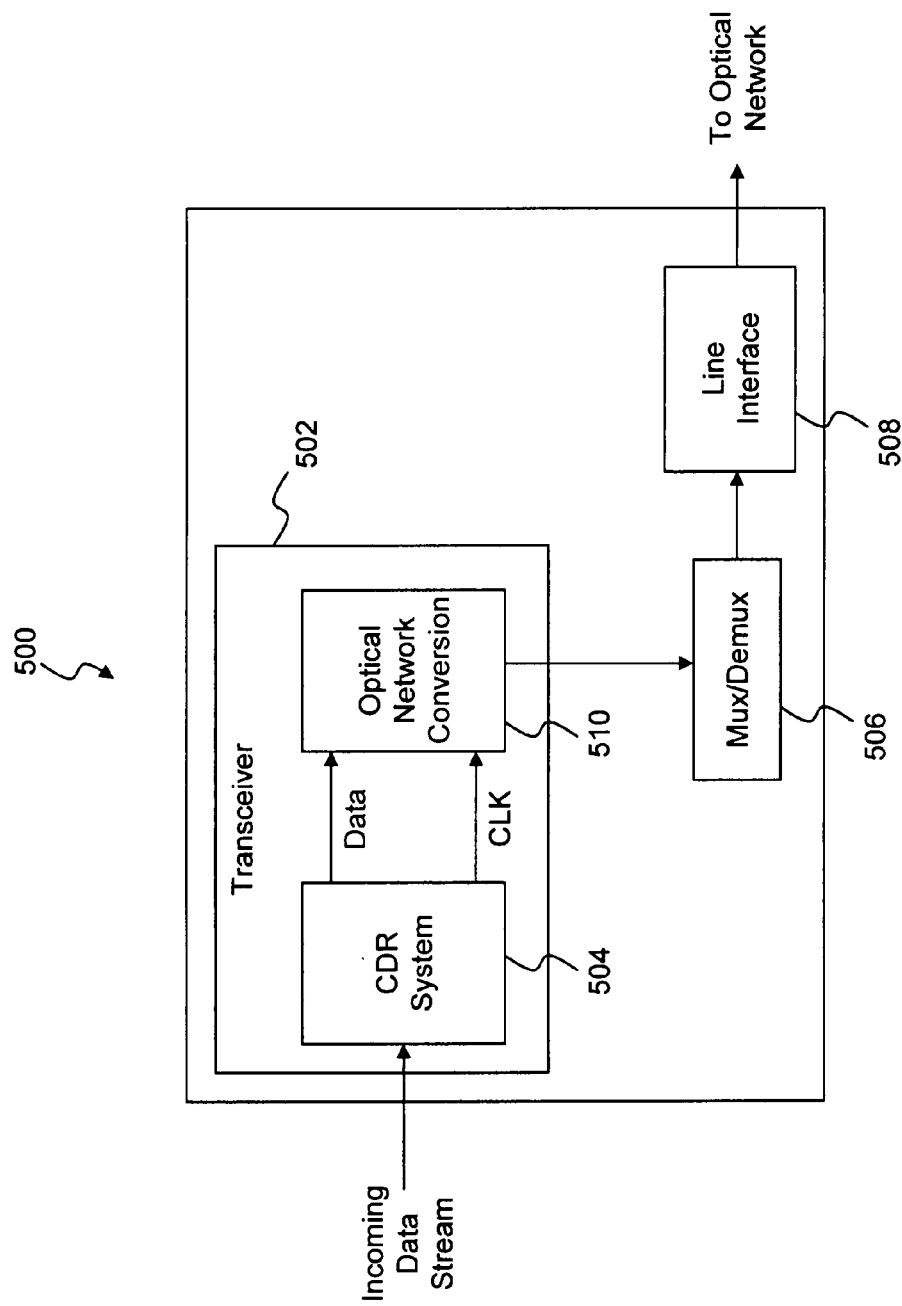
FIG. 5 shows a transceiver for use in a network element located in an optical network that includes one embodiment of a clock recovery system constructed in accordance with the present invention.

FIG. 5 shows a transceiver 502 for use in a network element (NE) 500 located in an optical network that includes one embodiment of a clock recovery circuit 504 constructed in accordance with the present invention. For example, the NE may be one of many NEs used in a Synchronous Optical Network (SONET) and the components in the NEs may include a multiplexer/demultiplexer 506 and a line interface 508. In one embodiment, a data stream is input to the transceiver 502 for transmission over the optical network. The CDR system 504, constructed in accordance with the present invention, operates to determine an optimal clock signal to associate with the data stream, and both the clock and data are input to optical conversion logic 510. The optical conversion logic converts the clock and data into optical signals suitable for transmission over the optical network. Thus, it is possible for network clients to provide a data stream to the transceiver 502 and the optimal clock for the data stream will be determined by the CDR system 504.

Accordingly, only one type of transceiver is required to handle any client data, since the CDR system 504 can determine the optimal clock regardless of the incoming data rate. This provides a great benefit to network operators, since the burden of adjusting transceivers for different data rates is eliminated. Furthermore, adding new traffic to the network is greatly simplified.

The present invention includes a system for determining an optimal clock to associate with a received data stream. The embodiments described above are illustrative of the present invention and are not intended to limit the scope of the invention to the particular embodiments described. Accordingly, while one or more embodiments of the invention have been illustrated and desc'ribed, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. A system for determining an optimal clock signal to associate with an incoming data stream, the system comprising:

a candidate clock generation circuit, comprising a phase detector, a loop filter having a filter output voltage, a plurality of voltage controlled oscillators, a first selector connected to the plurality of voltage controlled oscillators, and a second selector connected to the first selector, wherein each voltage controlled oscillator generates an output signal having a selected frequency that is determined by the voltage level of the filter output voltage, and wherein the number of voltage controlled oscillators determines the number of candidate clocks, that operates to receive the incoming data stream and generate at least one candidate clock signal;

a transition density detector circuit that operates to receive the incoming data stream and a selected candidate clock signal to determine a transition density parameter associated with the selected candidate clock signal, wherein the transition density parameter comprises the number of bit transitions in a selected measurement period;

a controller coupled to the generation circuit and the detector circuit and operable to control the input of each of the at least one candidate clock signals to the detector circuit as the selected candidate clock signal, so that one or more transition density parameters are determined, wherein the controller is operable to perform a timing function to determine the selected measurement period responsive to the incoming data stream, and wherein the controller operates to determine the optimal clock signal from the at least one candidate clock signal based on the one or more transition density parameters;

wherein the generation circuit locks the optimal clock signal to the incoming data stream; and wherein the system is operable to determine a new optimal clock signal responsive to a change in rate of the incoming data stream.

2. The system of claim 1, wherein the candidate clock generation circuit includes a selector circuit that selects one of the at least one candidate clock signals to output as the selected candidate clock signal based on a selection control signal, and the controller determines the selection control signal based on the one or more transition density parameters.

3. The system of claim 1, wherein the transition density detector circuit includes counter logic that counts transitions generated from the incoming data stream for the selected measurement period to form the transition density parameter.

4. The system of claim 3, wherein the transition density detector circuit includes comparator logic that receives the incoming data stream and the selected candidate clock signal to produce the transitions generated from the incoming data stream.

5. The system of claim 4, wherein the comparator logic comprises: first latch logic that receives the incoming data stream and the selected candidate clock signal to produce a first latch output signal;
second latch logic that includes a plurality of latch stages that are sequentially coupled together, the latch stages include a first latch stage that receives the incoming data stream and the selected candidate clock signal, and a last latch stage that outputs a second latch output; and
a combinatorial logic stage that receives the first latch output and the second latch output to produce the transitions generated from the incoming data stream.

6. The system of claim 5, wherein the plurality of latch stages comprise two latch stages.

7. The system of claim 5, wherein the plurality of latch stages comprise an n-bit shift register.

8. The system of claim 5, wherein the combinatorial logic stage comprises XOR logic.

9. The system of claim 5, wherein the first latch logic comprises a D-type flip-flop.

10. The system of claim 5, wherein the plurality of latch stages comprise a plurality of D-type flip-flops.

11. The system of claim 5, further comprising a memory coupled to the controller and wherein the transition density parameters are stored in the memory.

12. A method for determining an optimal clock signal to associate with an incoming data stream, the method comprising steps of:
receiving the incoming data stream;
generating at least one candidate clock signal from the incoming data stream, wherein the candidate clock signal is generated by a candidate clock generation circuit, comprising a phase detector, a loop filter having a filter output voltage, a plurality of voltage controlled oscillators, a first selector connected to the plurality of voltage controlled oscillators, and a second selector connected to the first selector, wherein each voltage controlled oscillator generates an output signal having a selected frequency that is determined by the voltage level of the filter output voltage, and wherein the number of voltage controlled oscillators determines the number of candidate clocks;
selecting a selected candidate clock signal from the at least one candidate clock signal;
determining a transition density parameter associated with the selected candidate clock signal, wherein the transition density parameter comprises the number of bit transitions in a selected measurement period and the selected measurement period is determined responsive to the incoming data stream;
repeating the steps of selecting and determining until all of the at least one candidate clock signals have been selected and associated transition density parameters have been determined;
determining the optimal clock signal from the at least one candidate clock signal based on the associated transition density parameters; and
locking the optimal clock signal to the incoming data stream.

13. The method of claim 12, wherein the step of determining a transition density parameter comprises steps of:
generating transitions from the incoming data stream and the selected candidate clock signal; and
counting the transitions during a selected measurement period to form the transition density parameter.

14. The method of claim 13, wherein the step of generating transitions from the incoming data stream comprises steps of:
receiving the incoming data stream and the selected candidate clock signal at first latch logic to produce a first latch output signal;
receiving the incoming data stream and the selected candidate clock signal at second latch logic that includes a plurality of latch stages that are sequentially coupled together, the latch stages include a first latch stage that receives the incoming data stream and the selected candidate clock signal, and a last latch stage that outputs a second latch output; and
combining the first latch output and the second latch output to produce the transitions generated from the incoming data stream.

15. The method of claim 14, wherein the step of receiving the incoming data stream and the selected candidate clock signal at the second latch logic comprises a step of receiving the incoming data stream and the selected candidate clock signal at the second latch logic that includes first and second latch stages that are sequentially coupled together, the first latch stage that receives the incoming data stream and the selected candidate clock signal, and the second latch stage outputs the second latch output.

16. The method of claim 14, wherein the step of combining is a step of combining the first latch output and the second latch output with XOR logic having an output that forms the transitions generated from the incoming data stream.

17. The method of claim 12, further comprising a step of storing the transition density parameters in a memory.

* * * * *